US009118305B2

(12) United States Patent
Jeffries et al.

(10) Patent No.: US 9,118,305 B2
(45) Date of Patent: Aug. 25, 2015

(54) DC RESTORATION FOR SYNCHRONIZATION SIGNALS

(71) Applicant: ANALOG DEVICES, INC., Norwood, MA (US)

(72) Inventors: Brad P. Jeffries, Browns Summit, NC (US); Peter Derounian, Greensboro, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 13/974,042

(22) Filed: Aug. 22, 2013

(65) Prior Publication Data

US 2015/0054559 A1    Feb. 26, 2015

(51) Int. Cl.
*H03L 5/00* (2006.01)
*H03K 5/003* (2006.01)

(52) U.S. Cl.
CPC ..................................... *H03K 5/003* (2013.01)

(58) Field of Classification Search
USPC ........... 327/92, 307, 423–424, 493–508, 587, 327/588
See application file for complete search history.

(56) References Cited

U.S. PATENT DOCUMENTS

| | | | |
|---|---|---|---|
| 4,125,812 A | 11/1978 | Polonio | |
| 4,214,271 A | 7/1980 | Jones et al. | |
| 4,577,223 A | 3/1986 | Fitch et al. | |
| 6,456,159 B1 * | 9/2002 | Brewer | 330/9 |
| 6,937,489 B2 * | 8/2005 | Hsieh et al. | 363/98 |
| 7,620,121 B1 | 11/2009 | Tetzlaff et al. | |
| 2003/0103364 A1 * | 6/2003 | Alfrey | 363/98 |
| 2003/0155896 A1 * | 8/2003 | Ezio et al. | 323/280 |
| 2005/0198674 A1 * | 9/2005 | Lin et al. | 725/78 |
| 2009/0244933 A1 * | 10/2009 | Wang et al. | 363/21.06 |

FOREIGN PATENT DOCUMENTS

| | | |
|---|---|---|
| EP | 1068705 | 9/2004 |
| WO | 2013/158088 | 10/2013 |

OTHER PUBLICATIONS

Extended Search Report for EP Application Serial No. 14179913.0 mailed Jan. 21, 2015, 7 pages.
Lazar Shifrin, "Digital Sync-Tip Clamping: A New Approach To Video-Signal Conditioning", EDN, Design Feature, XP-000873101, Oct. 8, 1998, 5 pages.

* cited by examiner

*Primary Examiner* — Brandon S Cole
(74) *Attorney, Agent, or Firm* — Patent Capital Group (57) ABSTRACT

In one example implementation, the present disclosure provides a direct current (DC) restoration circuit for restoring the DC component of a synchronization signal provided over an alternating current (AC) coupled link from a transmitting circuit to a receiving circuit. During a period of inactivity in the synchronization signal, the synchronization signal may experience a drift towards the common mode, and may affect the ability for the synchronization signal to properly trigger the receiving circuit. The DC restoration circuit is configured to hold the synchronization signal steady during the period of inactivity, and allow the AC component of the synchronization signal pass through to the receiving circuit during the period of activity to alleviate the problem of baseline drift in the synchronization signal.

23 Claims, 4 Drawing Sheets

DC RESTORATION FOR SYNCHRONIZATION SIGNALS

TECHNICAL FIELD OF THE DISCLOSURE

The present disclosure relates generally to maintaining a suitable direct current (DC) component across alternating current (AC) coupled links, and more particularly, to the maintaining a suitable DC component for synchronization signals across alternating current (AC) coupled links.

BACKGROUND

Circuits are typically composed of a plurality of modules. Modules are often provided in a signal path where one module may activate or synchronize with another module through synchronization signals across one or more links. For instance, a logic device (i.e., on the transmitting side) may output a synchronization signal across a link to another logic device (i.e., on the receiving side), which may then be triggered to perform a function according to timing pulses and/or triggered by threshold crossings of the synchronization signal.

Alternating current (AC) coupling, or capacitive coupling have been used in the link for performance reasons, where a capacitor is placed in series with the synchronization signal in the link. One issue with AC coupling is that for low frequency synchronization signals, the baseline would wander towards the common mode voltage if the synchronization signal is inactive for a relatively long period of time. Baseline wander in the received signal would cause an error on the receiving side because the ability of synchronization signal to properly trigger the logic device on the receiving side is affected.

OVERVIEW

The present disclosure relates generally to various DC restoration circuits and corresponding method(s) for restoring a synchronization signal to having a proper DC component. Specifically, a DC restoration circuit is provided for restoring a direct current (DC) component in an alternating current (AC) coupled link between a transmitting circuit and a receiving circuit. Due to baseline wander, a synchronization signal carried in an AC coupled link tend to drift towards a common mode voltage during a prolonged period of inactivity and may cause timing problems, e.g., when threshold crossings of the synchronization signal is used to trigger some function in the receiving circuit.

To alleviate the issue of baseline wander, the DC restoration circuit is provided to restore the DC component in a synchronization signal being transmitted from the transmitting circuit over the AC coupled link. The circuit provides the DC component of the synchronization signal (e.g., a restored synchronization signal) to the receiving circuit during a period of inactivity in the synchronization signal, and provides the AC component of the synchronization signal to the receiving circuit during a period of activity in the synchronization signal.

The circuit may provide the DC component of the synchronization signal by holding the synchronization signal to one of two voltages (i.e., predefined voltages with a certain bias corresponding to the swing of the synchronization signal). Accordingly, the synchronization signal is prevented from wandering towards the common mode voltage during the period of inactivity in the synchronization signal. When the synchronization signal returns to a period of activity with one or more timing pulses, the circuit allows the AC component to pass through (i.e., the synchronization signal is no longer held to the one of two voltages) to trigger the receiving circuit. Advantageously, the synchronization signal is held steady during a period of inactivity (i.e., the DC component of the synchronization signal is restored), and any timing pulses in the synchronization signal (i.e., the AC component of the synchronization signal) is passed to the receiving circuit with proper timing during the period of activity.

The DC restoration circuit may include a detector part for monitoring the level of the synchronization signal to determine the DC component of the synchronization signal during the period of inactivity. Furthermore, the DC restoration circuit may include an output part for restoring the synchronization signal by, e.g., summing the determined DC component and the monitored level of the synchronization signal and providing the restored synchronization signal to the receiving circuit during the period of inactivity. In some embodiments, the DC restoration circuit includes a filtering part for providing stability in the level of the synchronization signal being provided by the detector to the output part. Hardware implementations for the functions carried out by the detector part, the output part, and the optional filtering part may vary depending on the application, some examples of which are explained in detail herein.

According to one aspect, the DC restoration circuit comprises a holding circuit which is configured to hold the synchronization signal at a steady state during the period of inactivity. Specifically, the holding circuit is designed to have a strength that is weaker than the driving strength of the synchronization signal to allow the AC component of the synchronization signal to pass through during the period of activity.

DESCRIPTION OF EXAMPLE EMBODIMENTS OF THE DISCLOSURE

Figure 1:
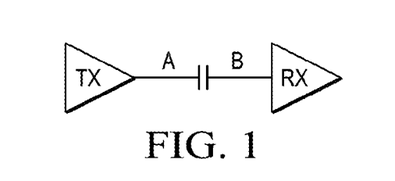
FIG. 1 depicts a schematic of an illustrative system having an AC coupled link.

FIG. 1 depicts a schematic of an illustrative system having an alternating current (AC) coupled link. The system comprises a transmitting circuit (denoted by "TX") configured to transmit a synchronization signal over the AC coupled link (shown with a capacitor in the link to provide capacitive coupling) to a receiving circuit (denoted by "RX"). The synchronization signal is used to trigger a function in the receiving circuit. For instance, the synchronization signal may have one or more timing pulses, and the receiving circuit may be triggered by or operate in response to threshold crossings of the synchronization signal (i.e., when the synchronization signal changes polarity, between "high" and "low" states). Proper functioning of the system relies heavily on the integrity of the synchronization signal. A correct synchronization signal ensures that function(s) in the receiving circuit would be triggered when needed and when the function(s) are being triggered, that the function(s) are being triggered at the right time.

Figure 2A:
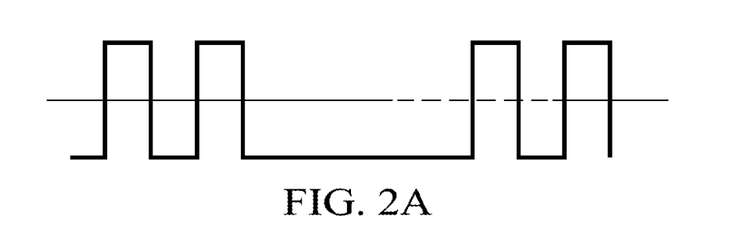
FIGS. 2A-B depict exemplary timing diagrams of the signal A and the signal B of the AC coupled link in FIG. 1.
Figure 2B:
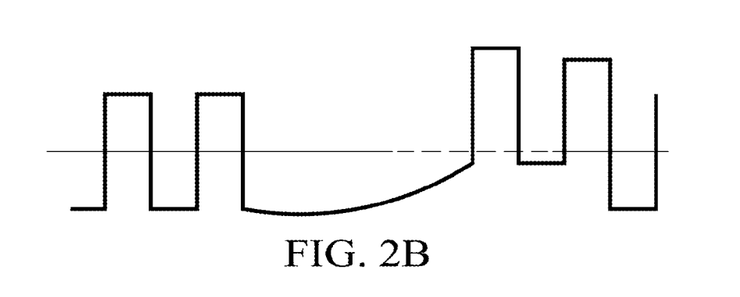

FIGS. 2A-B depict exemplary timing diagrams of the signal A and the signal B of the AC coupled link in FIG. 1. In the transmitting side, the exemplary signal A has a period of activity, followed by a period of inactivity, and then followed by a period of activity. The signal carries one or more timing pulses during the period of activity, and the signal is substantially steady during the period of inactivity. The synchronization signal overall may have a low frequency, with sparse timing pulse(s) during periods of activity in between relatively long periods of inactivity.

As shown in the timing diagram in FIG. 2A, exemplary Signal A represents the desired synchronization signal. During the period of activity, the signal has one or more timing pulses which triggers one or more functions in the receiving circuit. The timing pulses contributes to the AC component of the synchronization signal. During the period of inactivity, the synchronization signal has no timing pulses, and the signal is characterized by the direct current (DC) component of the synchronization signal. In some sense, the synchronization signal has a higher frequency during the (short) period of activity (because the signal carries timing pulses) and the synchronization signal has a lower frequency during the (prolonged) period of inactivity (because the signal is relatively steady).

Due to effects the AC coupled link across the transmitting circuit and receiving circuit, the actual received signal B may not always match up with the desired signal A. In particular, during the period of inactivity, issues arises in the synchronization signal, i.e., signal B, due to baseline wander/drift. As seen in FIG. 2B, the synchronization signal B during the period of inactivity droops/decays towards the common mode voltage of the AC coupled link. When the synchronization signal A begins to return to the period of activity with timing pulses after the period of inactivity, the synchronization signal B does not return to having a proper DC component for a certain period of time (e.g., for several timing pulses).

In the presence of baseline wander, the triggering of the receiving circuit using signal B may be particularly susceptible to noise, where (a small amount of) noise may cause incorrect threshold crossings (e.g., unintentionally tripping a threshold crossing comparator on the receiver side, detecting a change in polarity of the synchronization signal, etc.). Furthermore, the timing of the synchronization signal may be affected if the signal level does not return to a proper DC level when the timing pulses return after a period of inactivity (e.g., intended change in polarity is not detected, or not detected at the right moment in time, etc.). The timing of the receiving circuit triggered by threshold crossings (e.g., crossings at the dotted horizontal line) is thus affected, thereby affecting the proper functioning of the overall system shown in FIG. 1.

The issue of baseline wander or drift towards the common mode is more severe when the synchronization signal has very few, in some cases just one single, timing pulse(s) during the periods of activity in between prolonged periods of inactivity where the synchronization signal has the time to drift towards the common mode voltage. The fewer number of pulses gives less time/opportunity (versus a long train of pulses) to allow the synchronization signal to return to having a proper DC component in the AC coupled link during the period of activity.

In one example, analog to digital converter (ADC) encode clocks (i.e., an example of a synchronization signal) are typically AC coupled for performance. As ADCs add features such as clock dividers and data interfaces output synchronization signals that are needed to run at relatively low frequencies compared to the encode clocks, AC coupling of synchronization signals becomes problematic. In addition, as ADCs are developed in more advanced process technologies, the allowable input voltages decrease, increasing the desire to AC couple both clocks and synchronization signals (because the difference in voltages between the transmitting circuit and the receiving circuit grows larger). If a periodic signal is sparse (i.e., very low frequency synchronization signal or a gapped periodic signal that occurs very infrequently is passed across an AC coupled link, the DC components of the signal are moved. If this AC coupled signal is fed into a limiting amplifier the initial timing pulse will cause the correct logical output to occur but overtime the signal will decay back to the zero DC condition. The decay can cause noise to trip erroneous logical outputs or shift the timing of the inputs dependent upon the relative arrival of the inputs to the decay time constant.

On the RX side, the synchronization signal B experiences baseline wander and the timing of the received signal B can be affected after a period of inactivity relative to a period of time with a lot of signal transitions. If the synchronization signal B shifts beyond the comparator threshold on the RX side, the RX may fail to even register the incident synchronization signals (i.e., change in polarity) until enough have been received to restore the synchronization signal back to having the proper DC or baseline component/level.

It is noted that the issue of baseline wander in a synchronization signal is distinct from issues of DC drift in AC coupled data links. In AC coupled data links, the data signal is not characterized by (prolonged) periods of inactivity between (short) periods of activity. In some sense, data signals have a higher frequency overall when compared to a synchronization signal discussed within the context of this disclosure. Furthermore, issues of baseline wander in data signals do not cause timing problems that are present with a synchronization signal exhibiting baseline drift. In many cases, baseline wander is merely an artifact that is compensated for after the data signal has been received, and does not relate to any of the timing issues as discussed in relation to synchronization signals. Due to these differences, systems provided to correct DC drift in data links are likely not suitable for restoring the DC component in a synchronization signal.

Figure 3:
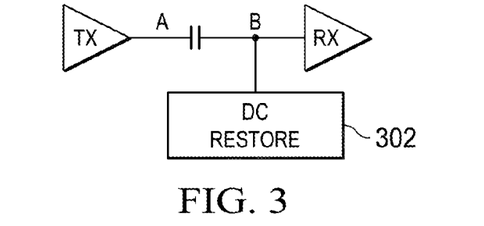
FIG. 3 depicts a schematic of an illustrative system having an AC coupled link and a DC restoration module, according to some embodiments of the disclosure.
Figure 4A:
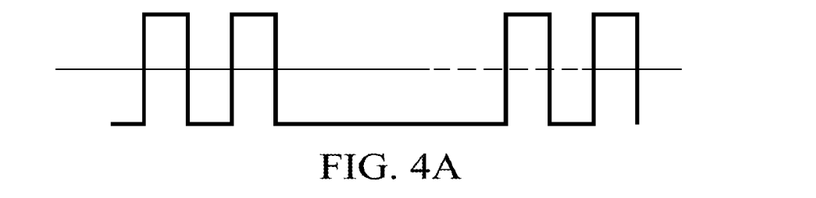
FIGS. 4A-B depict exemplary timing diagrams of the signal A and the signal B of the AC coupled link in FIG. 3.
Figure 4B:
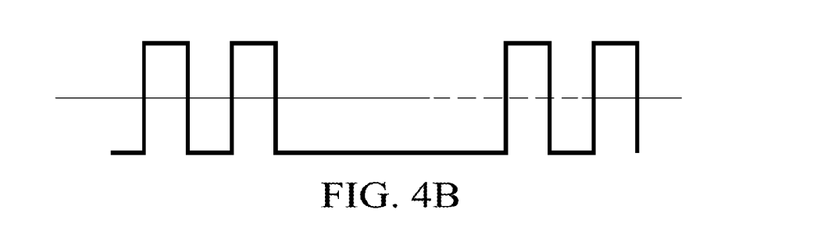

FIG. 3 depicts a schematic of an illustrative system having an AC coupled link and a DC restoration module, according to some embodiments of the disclosure. To alleviate issues of baseline drift, a DC restoration circuit 302 is provided on the receiving side to restore the synchronization signal to its proper DC component. The DC restoration circuit may be provided to prevent the received synchronization from drifting/drooping towards the common mode voltage of the AC coupled link. An ideal DC restoration circuit would allow the signal A and signal B to substantially resemble each other (as seen in the exemplary timing diagrams in FIGS. 4A and 4B of the signal A and B, respectively, of the AC coupled link in FIG. 3) so that the desired synchronization signal is actually received at the receiving circuit. By ensuring that the integrity of the synchronization signal is not affected by the period of inactivity, the receiving circuit is triggered by the synchronization signal B correctly when the synchronization signal returns to a period of activity (without having to wait for the synchronization signal to return having its proper DC component) and the overall system shown in FIG. 3 is able to function properly.

The DC restoration circuit 302 is configured to restore the DC component in a synchronization signal being transmitted from the transmitting circuit over the AC coupled link. In other words, if the synchronization signal is drifting towards the common mode voltage or attempts to drift towards the common mode voltage during the period of inactivity, the DC restoration circuit 302 may restore the synchronization signal to its proper DC component by generating a restored synchronization signal.

In some embodiments, the DC restoration circuit has a holding circuit that is configured to hold the synchronization signal at a steady state during the period of inactivity. It is noted that the holding circuit is not too strong to not allow the timing pulses in the period of activity to pass through to the receiving circuit. In other words, the strength of the holding circuit is weaker than the driving strength of the synchronization signal to allow the AC component of the synchronization signal to pass through during the period of activity. At the same time, the holding circuit is sufficiently strong to hold the synchronization signal at the steady state voltage as the synchronization signal attempts to drift towards the common mode voltage during the period of inactivity. The DC restoration circuit is configured to maintain a signal with the sufficient output resistance or strength, such that when the incoming signal toggles, the RX side of the AC coupling (signal B) will also toggle allowing the RX side to register the incoming transition. This feature is discussed in further detail in relation to FIG. 10.

The DC restoration circuit then provides the restored synchronization signal to the receiving circuit during a period of inactivity in the synchronization signal to alleviate the issue of baseline wander. When the period of activity in the synchronization signal returns, the DC restoration circuit provides the AC component of the synchronization signal to the receiving circuit. The DC restoration circuit allows timing pulses to pass through to the receiving circuit during the period of activity such that the receiving circuit can be properly triggered based on the timing pulses in the synchronization signal.

Figure 5:
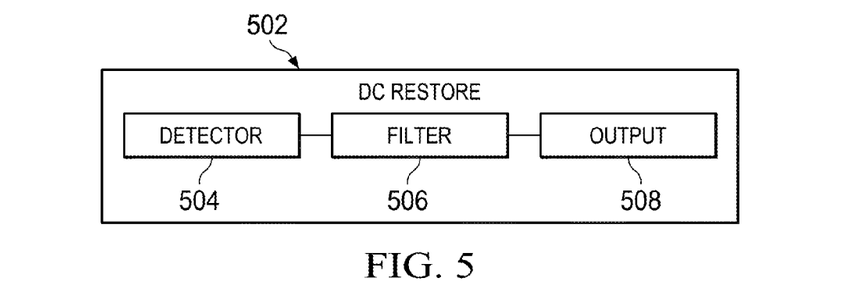
FIG. 5 depicts an exemplary schematic for a DC restoration circuit, according to some embodiments of the disclosure.

FIG. 5 depicts an exemplary schematic for a DC restoration circuit, according to some embodiments of the disclosure. The DC restoration circuit 502 may be configured with a detector part 504 and an output part 508. The DC restoration circuit 502 may optionally be provided with a filtering part 506. It is envisioned that the DC restoration circuit may not have the modules as shown to separately provide the functions of the detector part 504, the output part 508, and/or the filtering part 506. Rather, the DC restoration circuit may have one or more modules which provides the combined functions of two or more of: the detector part 504, the output part 508, and the filtering part 506. For instance, the DC restoration circuit may include a module which performs the functions of both the detector part 504 and the output part 508.

The detector part 504 may be configured to monitor the level of the synchronization signal. For instance, the detector part 504 may be configured to determine/monitor the DC component of the synchronization signal during the period of inactivity. In some cases, the detector part 504 may detect baseline wander in the synchronization signal, where the synchronization signal is at a level which is neither "high" or "low" but is decaying towards the common mode voltage. The output part 508 may be configured to restore the synchronization signal by holding the synchronization signal, e.g., during the period of inactivity or when baseline wander is detected. For instance, the output part 508 may be configured to sum the DC component determined by the detector part and the monitored level of the synchronization signal, and provide the restored synchronization signal to the receiving circuit during the period of inactivity. The optional filtering module 506 may be configured to provide stability in the level of the synchronization signal being provided by the detector to the output part to the output stage in the presence of such impairments as noise.

In some embodiments, the detector part 504 senses/measures the DC component of the synchronization signal. The detector part may not load the synchronization signal significantly. The output part 508 may perform the summing of the DC component with the monitored level of the synchronization signal without interfering with the AC component of the synchronization signal (i.e., the timing pulses are allowed to pass through). In certain embodiments, the DC restoration circuit (e.g. the output part 508) may include a holding circuit configured to hold the synchronization signal at a steady state during the period of inactivity.

The DC restoration circuit may be implemented in different ways. The following discussion describes several illustrative circuits configured to perform the functions of the DC restoration circuit.

Figure 6:
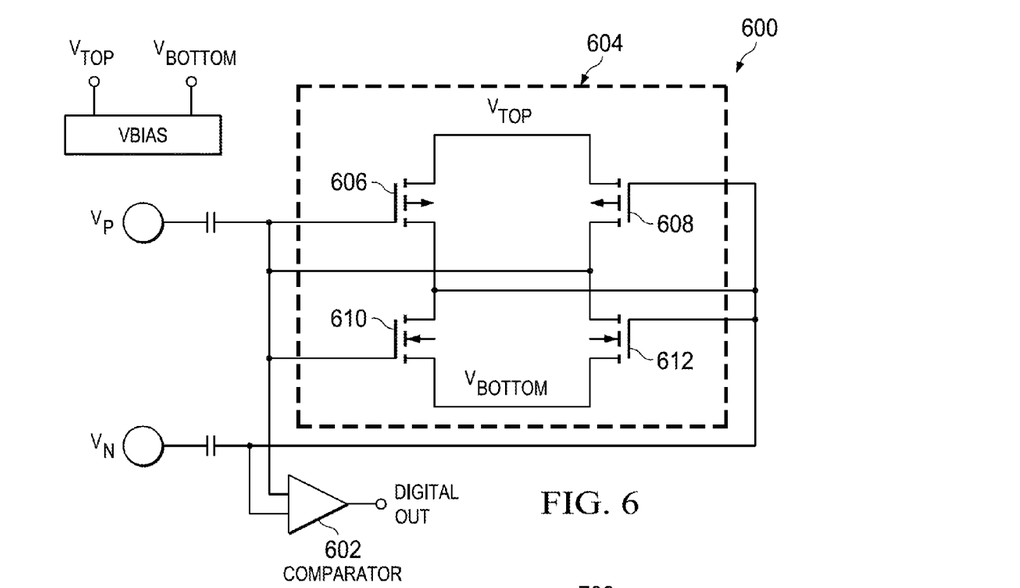
FIG. 6 depicts an exemplary circuit diagram for a DC restoration circuit, according to some embodiments of the disclosure.

FIG. 6 depicts an exemplary circuit diagram for a DC restoration circuit, according to some embodiments of the disclosure. The DC restoration circuit is suitable for a synchronization signal comprising a pair of differential signals $v_P$ and $v_N$ and the differential signals are being provided over the AC coupled links (as denoted by the capacitors, i.e., the capacitive coupling on the links carrying $v_P$ and $v_N$). The differential signals are provided as inputs to a comparator which generates a digital output $d_{OUT}$ by comparing $v_P$ and $v_N$. For instance, the comparator outputs a "low" or "0" for $d_{OUT}$ (i.e., denoted as "DIGITAL OUT" FIG. 6) when the synchronization signal is "low", and outputs a "high" or "1" for $d_{OUT}$ when the synchronization is "high". $d_{OUT}$ may be used to trigger some function in the receiving circuit. During a period of inactivity, $v_P$ and $v_N$ may drift towards the same voltage, i.e., the common mode voltage. Noise on either $v_P$ and $v_N$ may cause the comparator to toggle between "high" and "low" inappropriately and/or affect the timing of the comparator.

To alleviate the issue of drift during a period of inactivity in the synchronization signal, the DC restoration circuit comprises a cross coupled H bridge 604, which provides the functionality of a holding circuit for holding the synchronization signal steady, but allows the synchronization signal toggle to let the timing pulses pass through to trip the comparator during the period of activity in the synchronization signal. Specifically, the cross coupled H bridge 604 is configured to hold $v_P$ to a first voltage ($V_{TOP}$) and hold $v_N$ to a second voltage ($V_{BOTTOM}$) when $v_P$ is high and $v_N$ is low, and hold $v_P$ to $v_{BOTTOM}$ and hold $v_N$ to $V_{TOP}$ when $v_P$ is low and $v_N$ is high.

In some embodiments, the cross coupled H bridge comprises a pair of pMOSFETs (p-channel MOSFET (metal-oxide-semiconductor field-effect transistor)) having pMOS- FET 606 and pMOSFET 608 and a pair of nMOSFETs (p-channel MOSFET (metal-oxide-semiconductor field-effect transistor)) having pMOSFET 606 and pMOSFET 608 cross coupled in the manner shown in FIG. 6. Similar to a latch, the state of $v_P$ and $v_N$ tend to stick until a timing pulse causes the state to change in this cross coupled H bridge.

The voltage difference between $V_{TOP}$ and $V_{BOTTOM}$ corresponds to (in some instances is substantially equal to) the swing of the synchronization signal. For instance, the restoration level may be set by a voltage generator VBIAS. If VBIAS is made adjustable, the DC restoration circuit may accommodate input signals of various amplitudes. The device sizes in the H bridge may be adjusted to account for input signals of various drive strength, such that the strength of the holding function of the cross coupled H bridge is not too strong to prevent the driving source (i.e., timing pulses) to pass through. Device sizes may be a function of the implementation topology and the process node, e.g., device sizes may be different between 65 nM vs. 0.18 uM technology.

Figure 7:
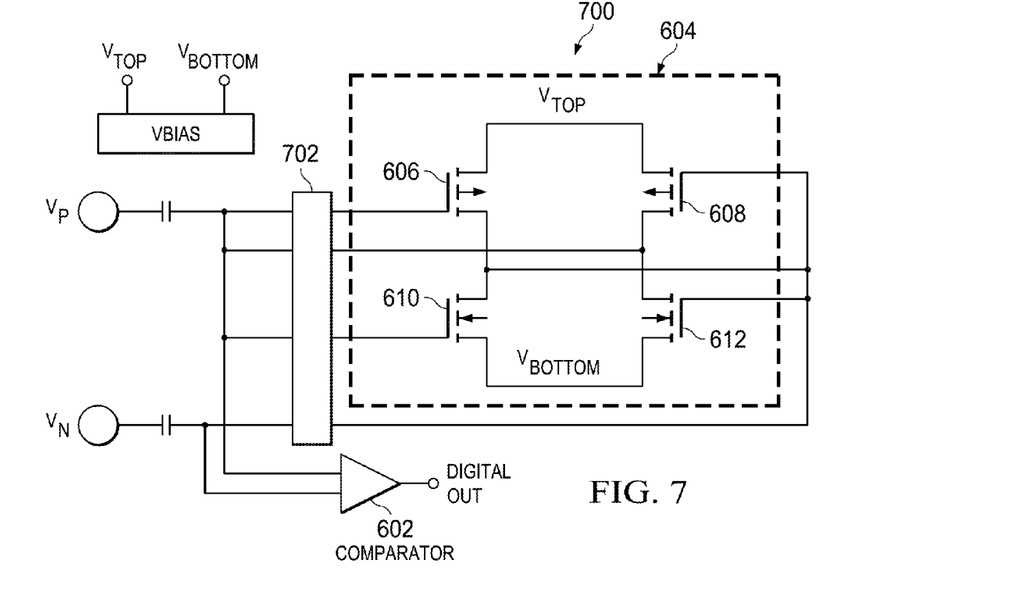
FIG. 7 depicts an exemplary circuit diagram for a DC restoration circuit, according to some embodiments of the disclosure.

FIG. 7 depicts an exemplary circuit diagram for a DC restoration circuit, according to some embodiments of the disclosure. The exemplary circuit 700 illustrates that a filtering part 702 may be added to a DC restoration circuit, such as the DC restoration circuit 600 shown in FIG. 6. The filtering part may include a resistor for the node $v_N$, and a differential capacitor and a resistor (provided in series) for the node $v_P$. In some sense, the filtering part includes a resistor-capacitor circuit to perform a filtering function with a particular bandwidth. For instance, the filtering part may be configured to filter out the AC component of the synchronization signal (a component of the synchronization signal of having a higher frequency) from the cross coupled H bridge (or any suitable holding circuit) and allow the synchronization signal to pass through to the cross coupled H bridge when the synchronization signal reaches a particular frequency dictated by the filtering part (e.g., the resistor-capacitor circuit). The filtering part may be designed with a particular bandwidth allow the cross coupled H bridge to have a holding effect on the synchronization signal (only) when the synchronization signal reaches a low enough frequency (indicating that the synchronization signal may be in a period of inactivity).

Figure 8:
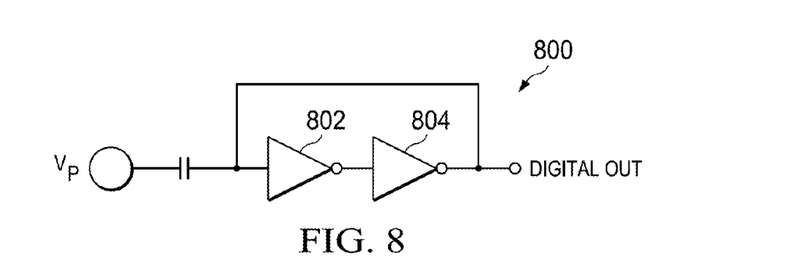
FIG. 8 depicts an exemplary circuit diagram for a DC restoration circuit, according to some embodiments of the disclosure.

FIG. 8 depicts an exemplary circuit diagram for a DC restoration circuit, according to some embodiments of the disclosure. The DC restoration circuit 800 comprises two (CMOS) logic inverters 802 and 804 connected in series. For instance, a synchronization signal, e.g., $v_P$ and/or $v_N$, may be provided as input to a series of two inverters in the configuration shown in FIG. 8. The output of the first inverter 802 is provided as input to the second inverter 804. The output of the second inverter 804 is coupled back to the input of the first inverter. Although only two inverters are shown, the double inverter design may be replicated if the synchronization signal is a differential signal having $v_P$ and $v_N$ (i.e., a pair of differential signals).

In this loop configuration with the two inverters, the DC restoration circuit holds the synchronization signal steady, such as during the period of inactivity to restore the synchronization signal back to having a proper DC component. In this example, the two inverters are used to perform the functions of the detector part, the filtering part, and the output part. This implementation may be suitable for CMOS level input signals. The second inverter size could be adjusted to accommodate input signals with more or less drive strength. For instance, the impedance of the second inverter may be sized to let the synchronization signal toggle from one state to another state during the period of activity.

Figure 9:
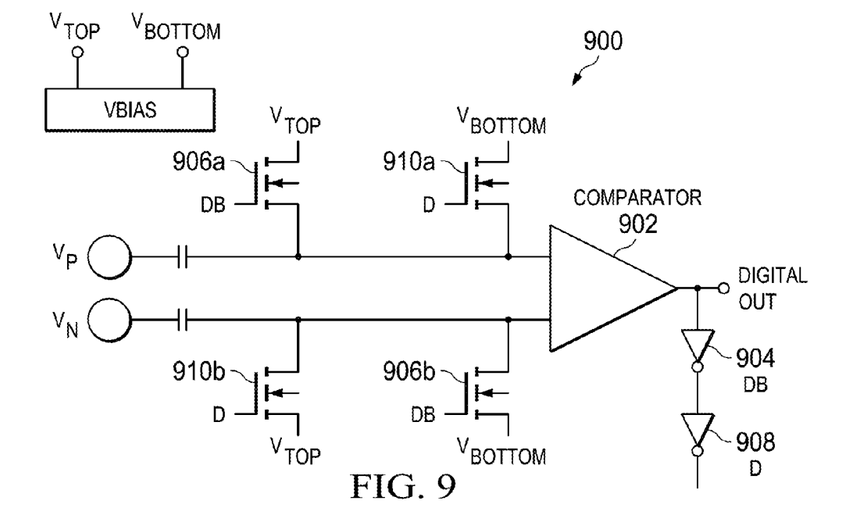
FIG. 9 depicts an exemplary circuit diagram for a DC restoration circuit, according to some embodiments of the disclosure.

FIG. 9 depicts an exemplary circuit diagram for a DC restoration circuit, according to some embodiments of the disclosure. In this exemplary circuit 900, the synchronization signal comprises a pair of differential signals, $v_P$ and $v_N$, and the differential signals are provided over the AC coupled links. In this circuit where a differential synchronization signal is used, $v_P$ and $v_N$ are provided as inputs to a comparator 902 to produce a digital output $d_{OUT}$ (i.e., denoted as "DIGITAL OUT" in FIG. 9). The circuit then uses the $d_{OUT}$ as a feedback signal to hold the synchronization signal steady, e.g., during the period of inactivity. In some sense, the comparator 902 is performing the function of a detector part, and the logical output of the comparator is used to turn on restoration/holding switches which holds the level of the synchronization steady during periods of inactivity.

To hold the synchronization signal steady, the output $d_{OUT}$ (i.e., denoted as "DIGITAL OUT" in FIG. 9) is coupled to a first inverter 904 to produce an output DB, the output DB is coupled to a first holding switch (e.g., comprising of nMOSFETs 906a and 906b) configured to, when $d_{OUT}$ is low (DB is low), hold $v_P$ to a first voltage ($V_{BOTTOM}$) and hold $v_N$ to a second voltage ($V_{TOP}$). Furthermore, the output DB is coupled to a second inverter 908 to produce an output D, the output D is coupled to a second holding switch (e.g., comprising of nMOSFETs 910a and 910b) configured to, when $d_{OUT}$ is high (DB is low and D is high), hold $v_P$ to $V_{TOP}$ and hold $v_N$ to $V_{BOTTOM}$.

The strength of the first holding switch and/or the second holding switch is less than the driving strength of the synchronization signal during the period of activity, such that the synchronization signal is able to toggle/switch states for providing timing pulses during the period of activity. For instance, the size of the restoration switches can be adjusted to account for various input drive strengths. In some embodiments, logic may be used to disable the switches if the restoration function was undesired. Similar to FIGS. 6 and 7, the voltage difference between $V_{TOP}$ and $V_{BOTTOM}$ corresponds to (in some instances is substantially equal to) the swing of the synchronization signal. This restoration level is set by a voltage generator VBIAS. If VBIAS is made adjustable this implementation could accommodate input signals of various amplitudes.

Figure 10:
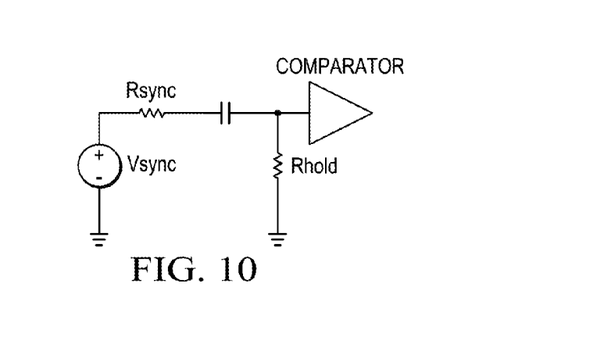
FIG. 10 depicts an equivalent circuit model for illustrating relative impedances of a DC restoration circuit, according to some embodiments of the disclosure.

FIG. 10 depicts an equivalent circuit model for illustrating relative impedances of a DC restoration circuit, according to some embodiments of the disclosure.

$$\frac{Rhold}{Rhold + Rsync} \times Vsync > \text{comparator threshold} \quad (1)$$

Rsync represents the Thevenin equivalent impedance of the synchronizing source, and Vsync represents the (voltage) amplitude of the synchronizing source. Rhold is the equivalent combination of the holding circuit (e.g., the DC restoration circuits disclosed herein) impedance (and any explicit termination impedances on the RX (i.e., receiving side)). Equation (1) gives the relationship of the impedances that allow for a valid synchronization pulse to be determined. One of the objectives is to ensure that the holding circuit is not too strong to not allow the AC component to pass through during the period of activity in the synchronization signal. The impedance of the driving source and the combination of the holding impedance with any explicit termination circuits creates a voltage divider that attenuates the sync amplitude. To trip the comparator properly, this attenuated amplitude (left side of the inequality) may be designed to be greater than the threshold required (right side of the inequality).

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that rely on synchronization signals to execute specialized software programs, or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A DC restoration circuit for restoring a direct current (DC) component in a synchronization signal being transmitted over alternating current (AC) coupled link(s) between a transmitting circuit and a receiving circuit, the DC restoration circuit configured to provide the DC component of the synchronization signal to the receiving circuit during a period of inactivity in the synchronization signal, and provide the AC component of the synchronization signal to the receiving circuit during a period of activity in the synchronization signal.

2. The circuit according to claim 1 comprises:
a detector part for monitoring the level of the synchronization signal to determine the DC component of the synchronization signal during the period of inactivity; and
an output part for restoring the synchronization signal by summing the determined DC component and the monitored level of the synchronization signal and providing the restored synchronization signal to the receiving circuit during the period of inactivity.

3. The circuit according to claim 1 comprises:
a filtering part for providing stability in the level of the synchronization signal being provided by the detector to the output part.

4. The circuit according to claim 1 comprises:
a holding circuit which is configured to hold the synchronization signal at a steady state during the period of inactivity, and the strength of the holding circuit is weaker than the driving strength of the synchronization signal to allow the AC component of the synchronization signal to pass through during the period of activity.

5. The circuit according to claim 1, wherein the receiving circuit is triggered by threshold crossings of the synchronization signal.

6. The circuit according to claim 1, wherein the frequency of the synchronization signal during the period of inactivity is less than the frequency of the synchronization signal during the period of activity.

7. The circuit according to claim 1 wherein the synchronization signal comprises a single pulse during the period of activity.

8. The circuit according to claim 1, wherein:
the synchronization signal comprises a pair of differential signals, $v_P$ and $v_N$, being provided over the AC coupled links;
the receiving side is triggered by the output of a comparator configured to compare $v_P$ and $v_N$; and
the circuit comprises a cross coupled H bridge configured to (1) when $v_P$ is high and $v_N$ is low, hold $v_P$ to a first voltage ($V_{TOP}$) and hold $v_N$ to a second voltage ($V_{BOTTOM}$), and (2) when $v_P$ is low and $v_N$ is high, hold $v_P$ to $V_{BOTTOM}$ and hold $v_N$ to $V_{TOP}$; wherein the voltage difference between $V_{TOP}$ and $V_{BOTTOM}$ corresponds to the swing of the synchronization signal.

9. The circuit according to claim 8, wherein:
the differential signals are coupled to the cross coupled inverter through a resistor-capacitor circuit configured to filter out the AC component of the synchronization signal from the cross coupled H-bridge and allow the synchronization signal to pass through to the cross coupled inverter when the synchronization signal reaches a particular frequency dictated by the resistor-capacitor circuit.

10. The circuit according to claim 1, wherein:
the circuit comprises a first inverter and a second inverter in series;
the synchronization signal is provided as input to the first inverter and the output of the second inverter is coupled back to the input of the first inverter;
the first inverter and the second inverter are configured to hold the synchronization signal steady during the period of inactivity; and
the impedance of the second inverter is sized to let the synchronization signal toggle from one state to another state during the period of activity.

11. The circuit according to claim 1, wherein:
the synchronization signal comprises a pair of differential signals, $v_P$ and $v_N$, being provided over the AC coupled links; and
the circuit comprises:
a comparator, wherein $v_P$ and $v_N$ are provided as inputs to produce an output $d_{OUT}$;

the output $d_{OUT}$ is coupled to a first inverter to produce an output DB, the output DB is coupled to a first holding switch configured to, when $d_{OUT}$ is low, hold $v_P$ to a first voltage ($V_{BOTTOM}$) and hold $v_N$ to a second voltage ($V_{TOP}$); and the output DB is coupled to a second inverter to produce an output D, the output D is coupled to a second holding switch configured to, when $d_{OUT}$ is high, hold $v_P$ to $V_{TOP}$ and hold $V_N$ to $V_{BOTTOM}$.

12. The circuit of claim 11, wherein the strength of the first holding switch and/or the second holding switch is less than the driving strength of the synchronization signal during the period of activity.

13. A method for restoring a direct current (DC) component of a synchronization signal being transmitted over alternating current (AC) coupled link(s) between a transmitting circuit and a receiving circuit, the method comprising:
providing the DC component of the synchronization signal to the receiving circuit during a period of inactivity in the synchronization signal; and
providing the AC component of the synchronization signal to the receiving circuit during a period of activity in the synchronization signal.

14. The method according to claim 13, further comprising:
monitoring, using a detector part, the level of the synchronization signal to determine the DC component of the synchronization signal during the period of inactivity;
restoring, using an output part, the synchronization signal by summing the determined DC component and the monitored level of the synchronization signal; and
providing, using the output part, the restored synchronization signal to the receiving circuit during the period of inactivity.

15. The method according to claim 13, further comprising:
filtering the synchronization signal to provide stability in the level of the synchronization signal being provided by the detector to the output part.

16. The method according to claim 13, further comprising:
holding the synchronization signal at a steady state during the period of inactivity using a holding circuit; wherein the strength of the holding circuit is weaker than the driving strength of the synchronization signal to allow the AC component of the synchronization signal to pass through during the period of activity.

17. The method according to claim 13, wherein:
the synchronization signal comprises a pair of differential signals, $v_P$ and $V_N$, being provided over the AC coupled links;
the receiving side is triggered by the output of a comparator configured to compare $v_P$ and $v_N$; and
the method further comprises, using a cross coupled H bridge,
(1) when $v_P$ is high and $v_N$ is low, holding $v_P$ to a first voltage ($V_{TOP}$) and holding $v_N$ to a second voltage ($V_{BOTTOM}$); and
(2) when $v_P$ is low and $v_N$ is high, holding $v_P$ to $V_{BOTTOM}$ and holding $v_N$ to $V_{TOP}$;
wherein the voltage difference between $V_{TOP}$ and $V_{BOTTOM}$ corresponds to the swing of the synchronization signal.

18. The method according to claim 17, wherein:
the differential signals are coupled to the cross coupled inverter through a resistor-capacitor circuit; and
the method further comprises, filtering out, using the resistor-capacitor circuit, the AC component of the synchronization signal from the cross coupled H-bridge and allow the synchronization signal to pass through to the cross coupled inverter when the synchronization signal reaches a particular frequency dictated by the resistor-capacitor circuit.

19. The method according to claim 13, wherein:
providing the synchronization signal as input to a first inverter and a second inverter connected in series, wherein the output of the second inverter is coupled back to the input of the first inverter;
holding, using the first inverter and the second inverter, the synchronization signal steady during the period of inactivity; and
wherein the impedance of the second inverter is sized to let the synchronization signal toggle from one state to another state during the period of activity.

20. The method according to claim 13, wherein:
the synchronization signal comprises a pair of differential signals, $v_P$ and $V_N$, being provided over the AC coupled links; and
providing $v_P$ and $v_N$ as inputs to a comparator to produce an output $d_{OUT}$;
wherein the output $d_{OUT}$ is coupled to a first inverter to produce an output DB, the output DB is coupled to a first holding switch and the output DB is coupled to a second inverter to produce an output D, the output D is coupled to a second holding switch; and
the method further comprises:
when $d_{OUT}$ is low, holding $v_P$ to a first voltage ($V_{BOTTOM}$) and holding $v_N$ to a second voltage ($V_{TOP}$) using the first holding switch; and
when $d_{OUT}$ is high, holding $v_P$ to $V_{TOP}$ and holding $v_N$ to $V_{BOTTOM}$ using the second holding switch.

21. The method according to claim 20, wherein the strength of the first holding switch and/or the second holding switch is less than the driving strength of the synchronization signal during the period of activity.

22. An apparatus for restoring a direct current (DC) component of a synchronization signal being transmitted over alternating current (AC) coupled link(s) between a transmitting circuit and a receiving circuit, the apparatus comprising:
means for providing the DC component of the synchronization signal to the receiving circuit during a period of inactivity in the synchronization signal; and
means for providing the AC component of the synchronization signal to the receiving circuit during a period of activity in the synchronization signal.

23. The apparatus according to claim 22, further comprising:
means for monitoring the level of the synchronization signal to determine the DC component of the synchronization signal during the period of inactivity;
means for restoring the synchronization signal by summing the determined DC component and the monitored level of the synchronization signal; and
means for providing the restored synchronization signal to the receiving circuit during the period of inactivity.

* * * * *